United States Patent [19]

Meyer et al.

[11] Patent Number: 4,842,937

[45] Date of Patent: Jun. 27, 1989

[54] METHOD OF DEPOSITING A WEAR-PROTECTIVE LAYER ON A CUTTING TOOL AND WEAR PROTECTIVE LAYER PRODUCED BY THE METHOD

[75] Inventors: Hans-Robert Meyer; Hans-Joachim Wiemann, both of Hamburg, Fed. Rep. of Germany

[73] Assignee: Ernst Winter & Sohn (GmbH & CO.), Hamburg, Fed. Rep. of Germany

[21] Appl. No.: 160,597

[22] Filed: Feb. 26, 1988

[30] Foreign Application Priority Data

Feb. 27, 1987 [DE] Fed. Rep. of Germany ....... 3706340

[51] Int. Cl.⁴ .................... C23C 28/04; B32B 7/02; B32B 15/04
[52] U.S. Cl. ...................................... 428/408; 428/698
[58] Field of Search ............... 428/698, 699, 408, 457, 428/213

[56] References Cited

U.S. PATENT DOCUMENTS

| | | | |
|---|---|---|---|
| 4,678,722 | 7/1987 | Cohen | 428/642 |
| 4,686,080 | 8/1987 | Hara et al. | 428/699 X |
| 4,734,339 | 3/1988 | Schachner et al. | 428/698 X |
| 4,764,434 | 8/1988 | Aronsson et al. | 428/698 X |

Primary Examiner—Nancy A. B. Swisher
Attorney, Agent, or Firm—Michael J. Striker

[57] ABSTRACT

A wear-protective layer for cutting tools is formed by the chemical vapor deposition or chemical plasma deposition or plasma sputtering by depositing a plurality of layers to a support of the cutting tool to form a multilayer in which each successive layer remoter from the support has a higher elasticity module and a greater diamond portion than the preceding layer. The outermost layer is a layer of diamond.

11 Claims, 2 Drawing Sheets (II)

METHOD OF DEPOSITING A WEAR-PROTECTIVE LAYER ON A CUTTING TOOL AND WEAR PROTECTIVE LAYER PRODUCED BY THE METHOD

BACKGROUND OF THE INVENTION

The present invention relates to a method of coating a cutter with a wear-protective layer of the type of the diamond film supported on a carrier or support made of metallic or non-metallic hard material and to a product produced by such method.

Cutting inserts for cutting tools, which are formed of metallic or non-metallic hard materials, have been known. Specific hard metals of sintered alloys, such as tungsten carbide, or cobalt, or tungsten carbide with titanium carbide and cobalt have been taken into consideration. Such cutting inserts are normally made of pure titanium carbide or, for example of aluminum oxide and titanium nitride or silicon nitride. However, in order not to handle pure metals the materials which have the highest elasticity module, such as boride, nitride or silicide, are to be considered.

It has been further known that cutting inserts made of materials of lesser hardness have been provided, to increase their resistance to wear, with a coating, for example of titanium nitride, or silicide nitride, or aluminum oxide or any other suitable material. Such coatings have been applied to carriers or supports of hard metals which have been normally utilized for machining steel, non-iron metals and other materials.

The application of such wear-protective layers to respective supporting elements has been obtained by known methods of chemical vapor deposition (CVD) or chemical plasma deposition or by reactive plasma sputtering.

In the chemical vapor deposition known as CVD, the production of thinner layers can be obtained by the chemical reaction of the gaseous components. This method finds application for example in the production of thin silicon layers in the semiconductor technology and also for the depositing of hydrocarbons of extreme hardness and high anisotropic heat conductivity.

It has been known from recent publications to use methane gas for depositing diamantine carbons whereby a desired material has been obtained under high vacuum and temperatures in the range of over 1,000 degrees C.

The so-called plasma-CVD method differs in that with a lower pressure, the heating of the gaseous phase is obtained by high frequency or electric charge such as the glow discharge, and ions of respective gaseous particles are deposited on respective supports so that metastable compounds, for example diamond can form.

In the third aforementioned known method, namely reactive plasma sputtering, the process of the cathode sputtering or disintegration is carried out, in which the rigid cathode is sputtered by ion bombarding and a layer is deposited on the substrate spaced from the cathode by few centimeters. This can take place in the gaseous phase of the reactive gas such as hydrogen or oxygen which is added to the plasma.

In practical applications of these recent technical developments the problem has arisen when for example cutting edges of the cutting or machining tools should be provided with wear-protective layers.

In addition to different heat expansion coefficients of the diamond and metals, further it should be taken into consideration that diamond has a very high elasticity module of about $10.5 \times 10^{11}$ N/m$^2$ whereas hard metals have the elasticity module about 4 to $5 \times 10^{11}$ N/m$^2$. Such substantial difference in elasticity modules leads to the fact that in such mechanical applications as treatments of metals or non-iron metals, forces which occur in such treatments lead to a premature breaking of the diamond films on their substrates which have a lesser elasticity modules or to the sputtering of the diamond film. Therefore, wear-protective layers of diamond applied to the suppports of the cutting tools, such as milling cutters, saws and the like, by any of known methods cannot be used in the industrial range.

SUMMARY OF THE INVENTION

It is an object of the present invention to provide an improved method of depositing a wear-protective layer with a diamond film on a support.

It is another object of the invention to provide a method in which various elasticity modules of the components of the layer would be calculated so that the maximal difference in the elasticity modules of those components would not negatively affect the wear or stress of the diamond film and the latter would have a longer life span than it was possible with conventional layers.

These and other objects of this invention are attained by a method of depositing a wear-protective layer including a diamond film to a support of a metallic or non-metallic hard material, comprising the steps of applying to said support by chemical vapor or plasma deposition a plurality of layers one on another to form said wear-protective layer as a multilayer so that an outermost layer in said multilayer is of diamond and each following layer remoter from said support is of the material which has a greater diamond portion and a higher elasticity module than the material of each preceding layer positioned below said following remoter layer. Thereby a gradually decreasing difference between the elastic module of the outermost diamond film and that of the material of the support would prevent the decay of the diamond film.

In order to form the wear-resistant layer so that the intermediate layers between the support and the outermost diamond film would have different increasing elasticity modules the values of which would be as close as possible to that of diamond it is expedient to deposit the multilayer on the support such that, for example the lowermost layer on the support would have 10% by weight of diamond, the second lowermost layer would have 20% by weight of diamond, the fifth layer—5% by weight of diamond and so forth and so on.

Nickel, cobalt or graphite can be used as binder materials with their weight percent decreasing from the support towards the outermost diamond film or layer. For example, the lowermost layer may have 90% by weight of binder material while the fifth one—50% by weight of binder material. It is assumed that during the production of the multilayer the binder material is deposited simultaneously with diamond.

It is understandable that a solely diamond layer is a layer of a diamantine carbon material.

Said outermost layer of diamond may have a greater thickness than the layers lying below said outermost layer.

Said outermost layer may have the thickness of 5 to 500 μm and the layers below said outermost layer have the thicknesses from 1 to 50 μm.

Each of said layers below said outermost layer diamond may include, in addition to said diamond portion, of a binder material selected from the group consisting of boride, nitride, silicide and carbides of metals.

Nickel or cobalt can be also utilized as a binder material. The layers of the wear-protective multilayer may include different binders.

The wear-protective layer may be advantageously utilized on cutting inserts of milling cutters or saws or blades.

The method according to the present invention, namely a step-wise deposition of the layers of different elasticity modules to produce a multilayer with the outermost layer as a diamond film can be suitable for various applications including the coating of complex-shaped surfaces, for example profiles with small teeth. Thus, the toothed tool, for example a toothed truing roller of grinding machines can be easily treated by the method of this invention.

The wear-protective layer according to the invention substantially increases stability of cutting tools of any kind, for example knives, blades and other objects which are non-metal, for example of glass, such as lenses.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figure 1:
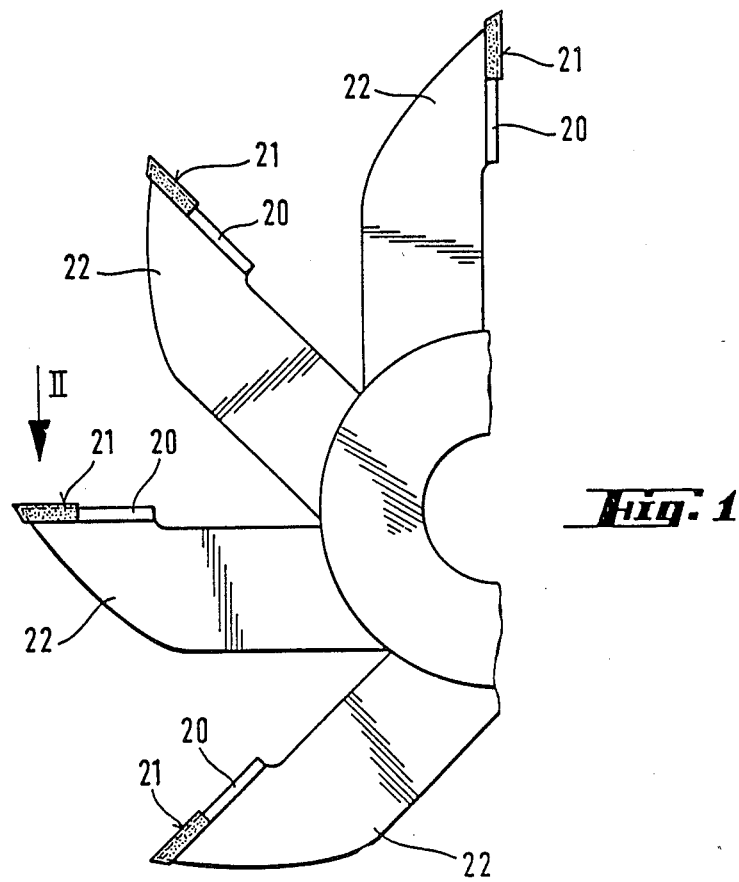
FIG. 1 is a partial front view of the milling cutter.

A milling cutter depicted in FIG. 1 comprises a plurality of teeth 22 which are circumferentially spaced from each other and each carrying a cutting insert 20 the cutting edge of which is provided with a wear-protecting multilayer 21 which carries a diamond film.

Figure 2:
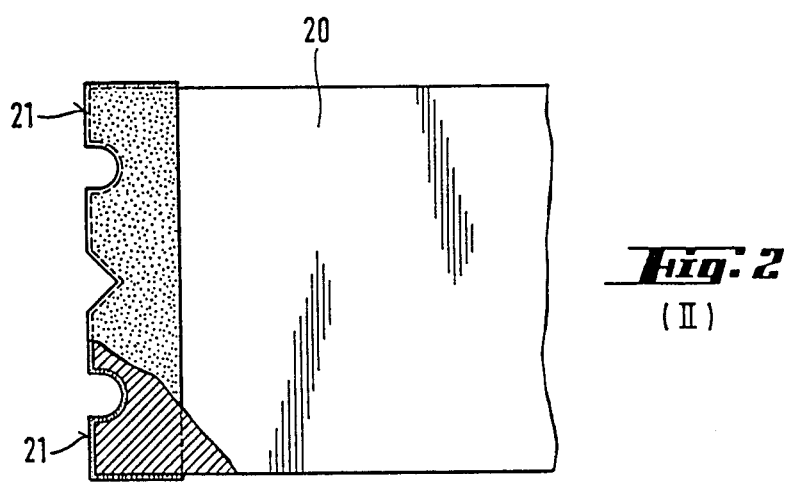
FIG. 2 is a partially sectional top plan view of the cutting insert of the milling cutter.

As shon in FIG. 2 which illustrates the cutting insert 20 in greater detail the external edge of the cutting insert has a profiled configuration so that all profiled surfaces are coated with the wear-protective layer during the plasma treatment.

Figure 3:
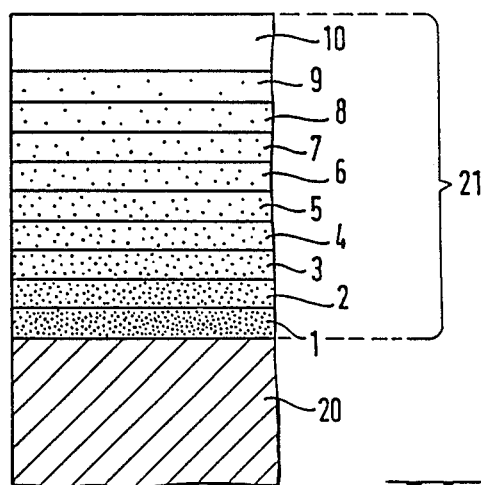
FIG. 3 is a sectional view of the multiple wear-protective layer according to the invention.
Figure 4:
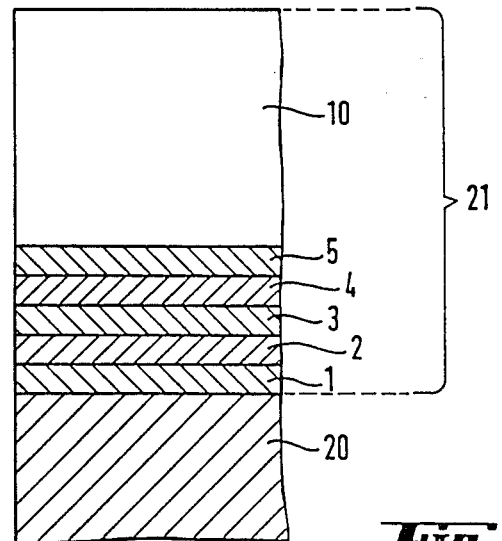
FIG. 4 is a sectional view of the multiple wear-protective layer of another embodiment.

Referring now to FIG. 3 it will be seen that the wear-protective multilayer according to the invention includes in the exemplified embodiment ten layers 1 to 10 which are deposited one over another on the support 20. These layers 1 to 10 and deposited on the support one after another in a step-like fashion by plasma treatment and differ from each other in hardness so that each layer positioned above the previously deposited layer has a higher elasticity module than that of the previously deposited lower layer. In the exemplified embodiment it is provided that layer 1 includes 10% by weight of diamond and 90% by weight of cobalt whereas layer 2 is composed of 20% of diamond and 80% of another metal. Such stepwise diamond-and-metal distribution continues also in the following layers so that the outermost layer 10 is comprised solely of the adamantine carbon.

When cobalt is used, for example as a binding material it is taken into consideration that during the depositing of the metal along with the diamond in the evaporation phase, the diamond infiltrated in the metal leads to the formation of carbide so that the utlization of metal carbides together with diamond within the layer is less suitable than the use of pure metals which form no carbides, such as nickel or cobalt.

In the embodiment shown in FIG. 3 the multilayer 21 carried on the support or cutting insert 20 includes intermediate layers which contain no diamond portions. The intermediate layers which are designated by reference numerals 1 to 5 have the thickness of few um whereas the outermost deposited diamond layer 10 has a considerably greater thickness than the lower layers so as to ensure a longer duration of protection against wear.

In this embodiment the support 20 is made of steel with the elasticity module of $2.2 \times 10^{11}$ N/m$^2$. Layer 1 is formed of tantalum carbide (TaC) with the elasticity module $2.9 \times 10^{11}$ N/m$^2$. Layer 2 is composed of titanium carbide (TiC) with the factor 4.7 while layer 3 is formed of molybdenum carbine (Mo$_2$C) with the factor 5.3 for the elasticity module. Layer 4 is made of tungsten carbide with the factor 7.2 for the elasticity module which amounts to $7.2 \times 10^{11}$ N/m$^2$.

The diamond layer denoted at 10 has the elasticity module $10.5 \times 10^{11}$ N/m$^2$ and is thereby supported on the comparatively softer steel support of the multilayer 1-5, the elasticity module of which is so high that the rigid setting or fit of the diamond layer remains ensured also with higher demands of the cutting tools.

It will be understood that each of the elements described above, or two or more together, may also find a useful application in other types of methods of depositing wear-protective layers on cutting tools differing from the types described above.

While the invention has been illustrated and described as embodied in a method of depositing wear-protective layer and a product produced by the method, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A wear-protective layer for a support of a metallic or non-metallic hard material, said layer being formed by chemical vapor deposition or plasma deposition as a multilayer comprising a layer of diamond, and means for reducing a difference in elasticity between said support and said layer of diamond said means comprising plurality of layers arranged to be located between said support and said layer of diamond and formed so that each following layer remoter from said support has a greater diamond portion and a higher elasticity module than each preceding layer positioned below said remoter layer.

2. The wear-protective layer as defined in claim 1, wherein said layer of diamond has a greater thickness than the layers lying below said outermost layer.

3. The wear-protective layer as defined in claim 1, wherein said layer has the thickness of 5 to 500 μm and the layers below said layer have the thicknesses from 2 to 50 μm.

4. The wear-protective layer as defined in claim 1, wherein each of said layers below said layer of diamond includes, in addition to said diamond portion, of a binder material selected from the group consisting of boride, nitride, silicide and carbides of metals.

5. The wear-protective layer as defined in claim 1, wherein each of said layers below said layer of diamond includes a binder material selected from the group consisting of nickel and cobalt.

6. The wear-protective layer as defined in claim 1, wherein said layers below said layer of diamond include different binder materials.

7. The wear-protective layer as defined in claim 1, wherein said support is a cutting insert of a cutting tool.

8. The wear-protective layer as defined in claim 7, wherein said tool is a milling cutter.

9. The wear-protective layer as defined in claim 7, wherein said tool is a saw.

10. The wear-protective layer as defined in claim 1, wherein said support is a form truing roller.

11. The wear-protective layer as defined in claim 1, wherein said support is formed as a blade.

* * * * *